(12) United States Patent
Bakhali

(10) Patent No.: US 12,325,311 B2
(45) Date of Patent: Jun. 10, 2025

(54) ACTIVE DISCHARGE DEVICE AND METHOD

(71) Applicant: Valeo Siemens eAutomotive France, Cergy (FR)

(72) Inventor: Yamna Bakhali, Cergy (FR)

(73) Assignee: Valeo Siemens eAutomotive France SAS, Erlangen (DE)

( * ) Notice: Subject to any disclaimer, the term of this patent is extended or adjusted under 35 U.S.C. 154(b) by 375 days.

(21) Appl. No.: 17/782,755

(22) PCT Filed: Dec. 4, 2020

(86) PCT No.: PCT/EP2020/084751
§ 371 (c)(1),
(2) Date: Jun. 6, 2022

(87) PCT Pub. No.: WO2021/110980
PCT Pub. Date: Jun. 10, 2021

(65) Prior Publication Data
US 2023/0001796 A1    Jan. 5, 2023

(30) Foreign Application Priority Data
Dec. 6, 2019 (FR) .................................. FR1913894

(51) Int. Cl.
*B60L 3/04* (2006.01)
*B60L 3/00* (2019.01)
*G01K 7/22* (2006.01)
*H02H 9/02* (2006.01)
*H02M 1/32* (2007.01)

(52) U.S. Cl.
CPC ............... *B60L 3/0046* (2013.01); *B60L 3/04* (2013.01); *G01K 7/22* (2013.01); *H02H 9/026* (2013.01); *H02M 1/322* (2021.05)

(58) Field of Classification Search
CPC .. B60L 3/00; B60L 3/04; B60L 3/0046; H02H 9/02; H02H 9/026; H02M 1/32; H02M 1/322; G01K 7/22; H03K 17/0822
(Continued)

(56) References Cited

U.S. PATENT DOCUMENTS 5,773,795 A * 6/1998 Messmer ............ A47J 36/2438
219/439
2011/0057627 A1    3/2011 Kuehner
(Continued)

FOREIGN PATENT DOCUMENTS

EP        2639916 A2    9/2013
JP    2006-311682 A    11/2006
(Continued)

OTHER PUBLICATIONS

Office Action issued in counterpart Korean Patent Application No. KR 10-2022-7023160 mailed Oct. 25, 2023 (16 pages).
(Continued)

*Primary Examiner* — Danny Nguyen
(74) *Attorney, Agent, or Firm* — Osha Bergman Watanabe & Burton LLP

(57) ABSTRACT

This device for actively discharging an electrical energy storage device has a branch having first and second ends connected respectively to positive and negative terminals of the electrical energy storage device, and between the two ends, a thermistor having a resistance that increases with a temperature of the thermistor and a switch designed to receive a control signal ($v_{GS}$) to change from an open state to a closed state, the thermistor and the switch being connected to one another so that, when the switch is closed, a discharge current ($i_D$) enters through the first end, flows through the thermistor (210) and the switch one after the other, and emerges through the second end; and a device for
(Continued)

controlling the switch. The control device is connected to the switch so as to provide the control signal ($v_{GS}$) independently of the resistance of the thermistor.

10 Claims, 5 Drawing Sheets

(58) Field of Classification Search
USPC .................................................. 361/103, 212
See application file for complete search history.

(56) References Cited

U.S. PATENT DOCUMENTS

| | | | | |
|---|---|---|---|---|
| 2012/0161710 | A1* | 6/2012 | Mai | B60L 58/22 |
| | | | | 320/118 |
| 2020/0259408 | A1* | 8/2020 | Bittner | H02M 7/5387 |
| 2021/0066016 | A1* | 3/2021 | Tada | H01M 10/425 |

FOREIGN PATENT DOCUMENTS

| | | |
|---|---|---|
| JP | 2016-086578 A | 5/2016 |
| JP | 2016-212948 A | 12/2016 |
| KR | 10-2015-0034406 A | 4/2015 |
| KR | 102205353 B1 | 1/2021 |
| WO | 2013/125010 A1 | 8/2013 |

OTHER PUBLICATIONS

International Search Report and Written Opinion in corresponding International Application No. PCT/EP2020/084751, mailed Feb. 10, 2021 (10 pages).

Office Action Issued in Corresponding JP Application No. 2022-533494, dated Jun. 6, 2023. (17 Pages with English Translation).

* cited by examiner

[Fig. 1]
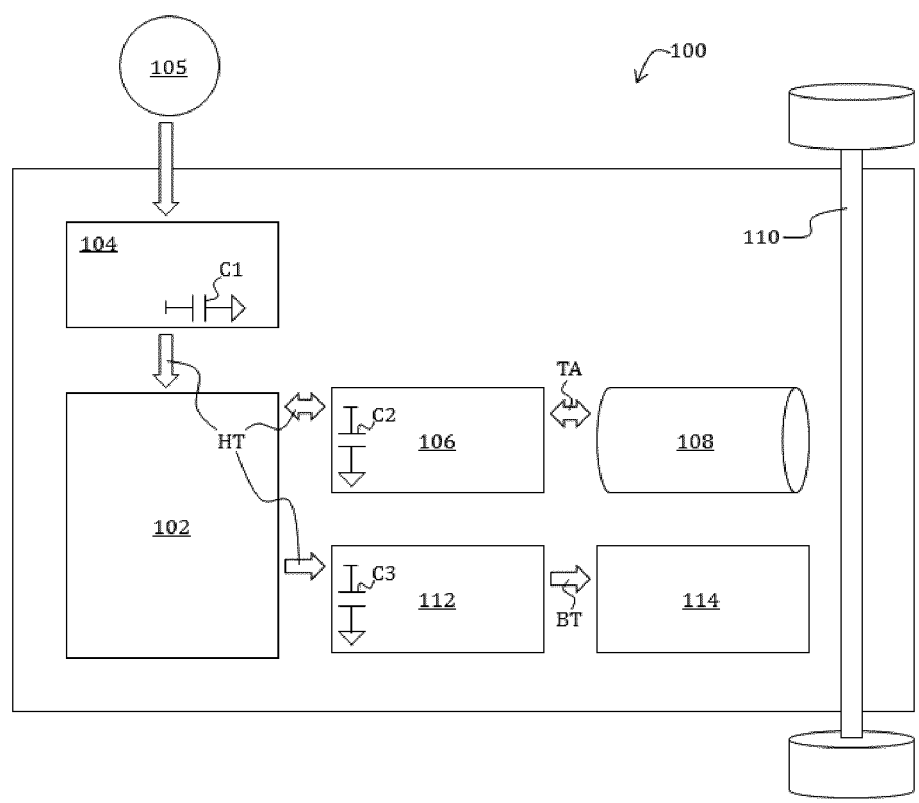

[Fig. 2]
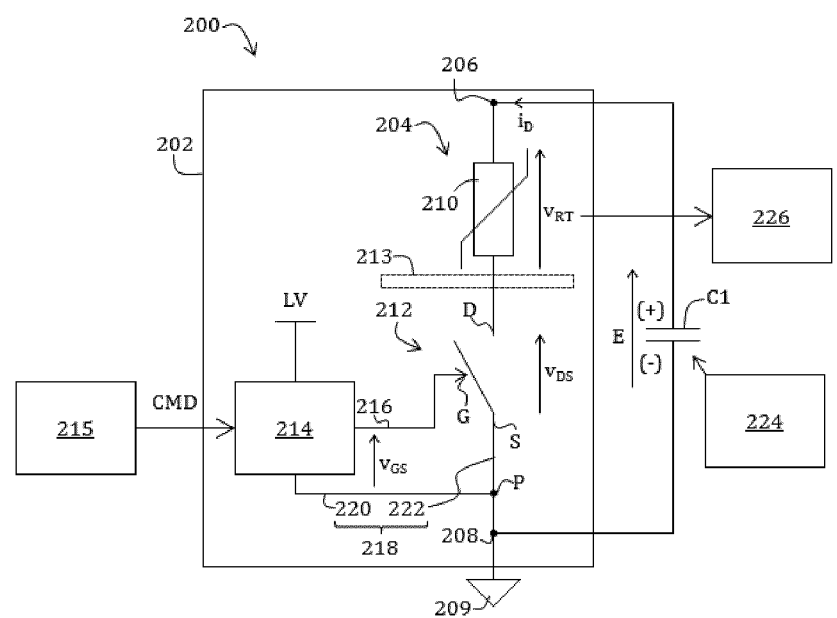

[Fig. 3]
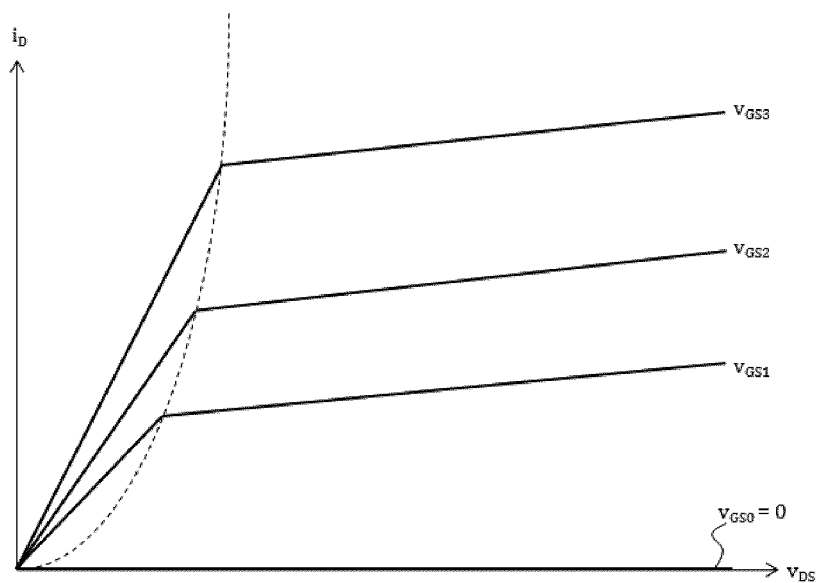

[Fig. 4]
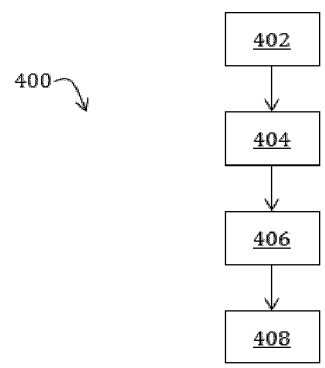

[Fig. 5]
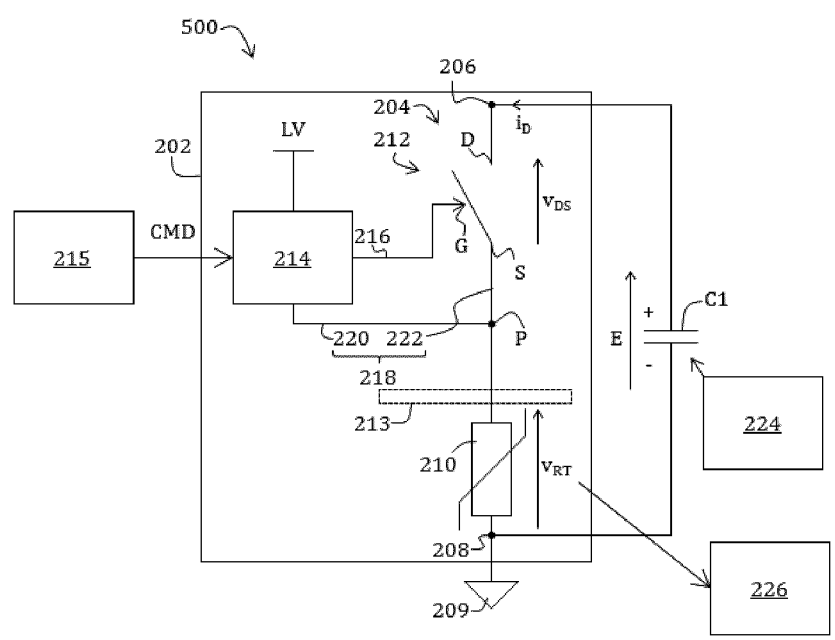

ACTIVE DISCHARGE DEVICE AND METHOD

TECHNICAL FIELD

The present invention relates to an active discharge method and device.

The invention applies particularly in the field of automobiles, in particular those having electrical propulsion or hybrid propulsion.

Specifically, such automobiles comprise: electrical components comprising electrical energy storage devices, for instance capacitors, at the input and/or output. The voltage across the terminals of these storage devices may be high, for example between 60 V and 1000 V. When the input or the output of the electrical component is disconnected, the electrical energy remains stored in the storage device. Thus, if a person comes in contact with the storage device, for example during a maintenance operation of the automobile, the stored energy may be discharged to this person and injure them.

In order to avoid this, it is known to use an active discharge device designed to discharge the electrical energy storage device on command. Since a large amount of electrical energy must be discharged in a short time, the power dissipated by the active discharge device is high, which may lead to heating of its component parts, possibly to the extent of starting a fire. Protection against heating is therefore generally provided.

PRIOR ART

For example, the patent application published under the number US 2011/0057627 A1 describes a device for actively discharging an electrical energy storage device, of the type comprising:
a branch comprising:
first and second ends intended to be connected respectively to positive and negative terminals of the electrical energy storage device, and
between the two ends, a thermistor having a resistance that increases with a temperature of the thermistor and a switch designed to receive a control signal in order to change from an open state to a closed state, the thermistor and the switch being connected to one another so that, when the switch is closed, a discharge current enters through the first end, flows through the thermistor and the switch one after the other, and emerges through the second end; and
a device for controlling the switch.

In this patent application, the switch is a field-effect transistor with a metal oxide gate (metal oxide semiconductor field-effect transistor, or MOSFET), having: a current input drain, a current output source and a gate. For this switch, the control signal is the gate-source voltage. More precisely, the switch is open when the gate-source voltage is zero and closed when it is nonzero. In the latter case, the discharge current drawn by the switch increases with the gate-source voltage. Furthermore, the thermistor is connected to the source of the switch and the control device is arranged in order to provide a closure voltage of the switch between the thermistor and the gate of the switch. Because of the presence of a Zener diode at the output of the control device, the closure voltage is substantially constant. Thus, the gate-source voltage is equal to the difference between the closure voltage (constant) and the voltage across the terminals of the thermistor.

In the event of heating of the switch, the temperature of the thermistor rises because of the thermal coupling between the switch and the thermistor, which leads to an increase of the resistance and therefore of the voltage across its terminals. This results in a decrease of the gate-source voltage and therefore a decrease of the discharge current flowing through the switch, which limits its heating.

One problem of the active discharge device proposed in the aforementioned patent is that most of the heat is necessarily dissipated in the switch, which may reduce its lifetime or even damage it.

It may thus be desirable to provide an active discharge device which makes it possible to reduce the power dissipated by the switch.

SUMMARY OF INVENTION

A device of the aforementioned type for actively discharging an electrical energy storage device is therefore proposed, characterized in that the control device is connected to the switch so as to provide the control signal independently of the resistance of the thermistor.

Specifically, in the patent application above, since the gate-source voltage depends on the resistance of the thermistor, the thermistor must necessarily have a low resistance so that the voltage across its terminals is not too high and does not negate the gate-source voltage at a very low discharge current.

By virtue of the invention, the control device provides the thermistor with the control signal independently of the resistance. Thus, the thermistor may be selected with a very high resistance so that it dissipates most of the discharge current. The switch then needs to dissipate only a small part of the discharge power and presents no risk of heating and wear over time.

Optionally, the active discharge device furthermore comprises at least one connection for providing the control signal, which connects the control device to the switch, and in which the thermistor is located outside each connection for providing the control signal. In other words, the connection between the control device and the switch for providing the control signal does not include said thermistor.

Also optionally, the switch has an input terminal for the discharge current, an output terminal for the discharge current and a control terminal, the control signal is a control voltage between the control terminal and the output terminal, and the active discharge device comprises two connections for providing the control signal, which connect the control device respectively to the control terminal and to the output terminal.

Also optionally, the thermistor is connected between the first end of the branch and the input terminal of the switch.

Also optionally, the thermistor is connected between the output terminal of the switch and the second end of the branch.

Also optionally, the connection for providing the control signal, which connects the control device to the output terminal, comprises a connection between the control device and a point of the branch that is located between the output terminal of the switch and the thermistor.

Also optionally, the thermistor is thermally decoupled from the switch, for example by means of a thermal insulation barrier interposed between them.

Also optionally, the thermistor is located at a distance of at least 1 cm from the switch.

Also optionally, the resistance of the thermistor at 25° C. is at least 10 times higher, preferably 100 times higher, more preferably 1000 times higher, than a resistance of the switch in the closed state.

Also optionally, the thermistor is designed to perform one or more, preferably all three, of the following functions:
 dissipating more power than the switch;
 limiting the discharge current when the temperature of the thermistor rises; and
 having a voltage representative of the discharge current, which is measured by a verification module designed to send an error message when the measured voltage is different than a voltage expected according to a command of the switch.

A method for actively discharging an electrical energy storage device is also proposed, comprising:
 providing a control signal to a switch in order to make it change from an open state to a closed state, the switch forming part of a branch which, in addition to the switch, comprises:
  first and second ends respectively connected to positive and negative terminals of the electrical energy storage device,
  a thermistor having a resistance that increases with a temperature of the thermistor, the thermistor and the switch being connected to one another between the two ends;
 changing the switch to the closed state so that a discharge current enters through the first end, flows through the thermistor and the switch one after the other, and emerges through the second end;
 maintaining the control signal independently of variations in the resistance of the thermistor during a discharge time.

BRIEF DESCRIPTION OF THE FIGURES

The invention will be understood more clearly with the aid of the following description, which is given solely by way of example and is provided with reference to the appended drawings, in which:

FIG. 1 schematically represents an automobile having electrical propulsion or hybrid propulsion with electrical components, some of which comprise at least one energy storage device, FIG. 2 is a circuit diagram of an active discharge device, according to a first embodiment of the invention, of one of the energy storage devices of FIG. 1, FIG. 3 is a graph representing current-voltage characteristics of a switch of the active discharge device of FIG. 2, FIG. 4 illustrates the successive steps of an active discharge method according to one embodiment of the invention, and FIG. 5 is a circuit diagram of an active discharge device, according to a second embodiment of the invention, of one of the energy storage devices of FIG. 1.

DETAILED DESCRIPTION OF THE INVENTION

Referring to FIG. 1, an automobile 100 having electrical propulsion or hybrid propulsion (with an electric motor and a heat engine) comprises various electrical components.

In particular, the automobile 100 firstly comprises a high-voltage battery 102 designed to provide a DC high voltage HT of more than 60 V, generally between 60 V and 1000 V.

The automobile 100 furthermore comprises a charger 104 designed to charge the high-voltage battery 102 from an electrical network 105.

The automobile 100 furthermore comprises an inverter/rectifier 106 designed in order selectively either to provide at least one AC voltage TA from the high voltage HT or to recharge the high-voltage battery 102 from the AC voltage or voltages TA.

The automobile 100 furthermore comprises an electric motor 108 for powering the driving wheels 110 of the automobile 100. The electric motor 108 is supplied by the AC voltage or voltages TA. Generally, the electric motor 108 can furthermore function in a generator mode, in which the powering of the wheels 110 generates the AC voltage or voltages TA so that the inverter/rectifier 106 recharges the high-voltage battery 102.

The automobile 100 furthermore comprises a DC-DC converter 112 designed to provide a DC low voltage from the high voltage HT.

The automobile 100 furthermore comprises a low-voltage battery 114 designed to provide various electrical systems (not represented) of the automobile 100 with the low voltage BT in order to supply them. The low-voltage battery 114 may furthermore be recharged by the high-voltage battery 102 through the DC-DC converter 112.

The charger 104, the inverter/rectifier 106 and the DC-DC converter 112 each have a capacitor, respectively C1, C2 and C3, to which the high voltage HT is applied while thereby storing a large amount of energy.

Referring to FIG. 2, an active discharge device 200 according to a first embodiment of the invention, which is present in the automobile 100, will now be described.

The active discharge device 200 is designed to discharge an electrical energy storage device of the automobile 100 on demand. For example, each of the capacitors C1 to C3 and batteries 102, 114 may be associated with an active discharge device such as the active discharge device 200. In the description below, the case of actively discharging the capacitor C1 will be taken as a nonlimiting example.

The active discharge device 200 firstly comprises a printed circuit board (PCB) 202.

The active discharge device 200 furthermore comprises, on the printed circuit board, a current discharge branch 204 comprising firstly a first end 206 connected to a positive terminal (+) of the capacitor C1 in order to receive a discharge current in and a second end 208 connected to a negative terminal (−) of the capacitor C1, for example through an electrical ground 209 to which the negative terminal (−) is connected.

The branch 204 furthermore comprises, between the two ends 206, 208, a thermistor 210 intended, in the example described, to fulfill three functions: a first function of dissipating power, a second function of thermally protecting the discharge and a third function of verifying correct operation of the discharge. These three functions will become apparent upon reading the rest of the description. The branch 204 furthermore comprises a switch 212, again between the two ends 206, 208. The thermistor 210 and the switch 212 are connected to one another so that the discharge current $i_D$ flows through them one after the other. In the example described, the thermistor 210 is connected to the first end 206 while the switch 212 is connected to the second end 208. Thus, the discharge current $i_D$ flows first through the thermistor 210 and then through the switch 212.

The thermistor 210 is a positive temperature coefficient (PTC) thermistor, which is to say it has a resistance RT that increases with a temperature of the thermistor 210. Preferably, the active discharge device 200 uses a thermistor having a very high resistance RT, for example between 1 kΩ and 100 kΩ, at 25° C.

The switch 212 is designed to receive a control signal that defines its state, open or closed. In the open state, the switch 212 breaks the branch 204 so that the discharge current $i_D$ is zero. In the closed state, the switch 212 drains the discharge current $i_D$. In the latter case, it then has a low resistance r, generally between 1 mΩ and 100 mΩ. Thus, the resistance RT at 25° C. is at least 10 times higher, and preferably 100 times higher, or even 1000 times higher, than the resistance r. In this way, during the discharge, most of the power is dissipated in the thermistor 210. More precisely, the thermistor 210 dissipates the power $RT \times i_D^2$, while the switch 212 dissipates the power $r \times i_D^2$. Thus, when the resistance RT is 100 times higher than the resistance r, the thermistor 210 dissipates 100 times more energy than the switch 212. Thus, the switch 212 is heated very little and has a very low risk of causing a fire to start.

The thermistor 210 and the switch 212 preferably are thermally decoupled from one another so that the thermistor 210 does not heat the switch 212. This may be obtained by separating them from one another by a distance of at least 1 cm and/or by using a thermal insulation barrier 213.

The switch 212 has input and output terminals D and S for the discharge current $i_D$, as well as a control terminal G. In the example described, the control signal is a control voltage $V_{GS}$ between the control terminal G and the output terminal S. Furthermore, the resistance r is the resistance between the input and output terminals D and S.

In the example described, the switch 212 is a field-effect transistor with a metal oxide gate (metal oxide semiconductor field-effect transistor, or MOSFET) having, as is known per se, a drain, a source and a gate, respectively forming the input terminal D, the output terminal S and the control terminal G.

The switch 212 may also be a bipolar transistor, an insulated gate bipolar transistor (IGBT), a thyristor or any other controllable switch.

The active discharge device 200 furthermore comprises a device 214 for controlling the switch 212, which is connected to the switch 212 so as to provide it with the control signal $V_{GS}$, independently of the resistance RT of the thermistor 210, in response to the reception of a discharge command CMD coming for example from a computer 215 of the automobile 100. The control device 214 is preferably supplied by the low voltage LV of the low-voltage battery 114. The control device 214 may also be supplied indirectly by the high voltage HT of the high-voltage battery 102.

In the example described, the active discharge device 200 comprises two connections 216, 218 for providing the control signal $V_{GS}$, which connect the control device 214 respectively to the control terminal G and to the output terminal S of the switch 212. It will be appreciated that, since the thermistor 210 is connected between the first end 206 and the input terminal D, it is located outside each of these connections 216, 218 for providing the control signal $V_{GS}$. Thus, the connections 216, 218 for providing the control signal $V_{GS}$ avoid or circumvent the thermistor 210.

More precisely, the active discharge device 200 comprises a connection 220 between the control device 214 and a point P of the branch 204 that is located between the output terminal S and the second end 208. Thus, the connection 218 for providing the control signal $V_{GS}$, which connects the control device 214 to the output terminal S, comprises the connection 220 and the portion 222 of the branch 204 that extends between the point P and the output terminal S.

Thus, the control signal $V_{GS}$ is defined by the control device 214 and is independent of the resistance RT of the thermistor 210.

The control signal $V_{GS}$ provided by the control device 214 may have a substantially constant value (after a time of establishing the control signal $V_{GS}$) or alternatively may vary during the discharge, depending on the type of control desired.

In addition, the active discharge device 200 comprises a diagnostic module 224 designed to verify correct operation of the switch 212 (for example, the value of the voltage $v_{DS}$) and, in case of detecting a malfunction of the switch 212, to interrupt the active discharge command CMD in order to stop the active discharge.

Furthermore, the active discharge device 200 comprises a verification module 226 designed to verify correct operation of the discharge. To this end, the verification module 226 is designed to monitor the current $i_D$ by measuring the voltage $v_{RT}$ across the terminals of the thermistor 210. It is furthermore designed to compare the measured voltage with the voltage expected according to the command CMD. In case of divergence, the module 226 is designed to transmit an error message to the computer 215. In order to measure the voltage $v_{RT}$, the verification module 226 is connected to the terminals of the thermistor 210, for example to the terminals 206 and D.

In the example illustrated in FIG. 2, the capacitor C1 has a voltage E equal to the sum of the voltage $v_{RT}$ across the terminals of the resistor and the voltage $v_{DS}$ across the terminals of the switch 212. Thus, a rise in the temperature of the thermistor 210 leads to an increase of the voltage $v_{RT}$, and therefore to a decrease of the voltage $v_{DS}$.

FIG. 3 represents a current $i_D$–voltage $v_{DS}$ characteristic of the switch 212 for various increasing values, respectively $v_{GS0}=0<v_{GS1}<v_{GS2}<v_{GS3}$, of the voltage $v_{GS}$. As may be seen, for all the values of $v_{GS}$, the discharge current $i_D$ decreases when the voltage $v_{DS}$ decreases. The result of this is that the rise in the temperature of the thermistor 210 leads to the decrease of the discharge current $i_D$, which reduces the heating of the thermistor 210. Thus, the temperature of the thermistor 210 is regulated, which reduces the risk of excessive heating of the latter and therefore the risk of a "hazardous thermal event" (HTE).

Referring to FIG. 4, an active discharge method 400 according to the invention will now be described.

During an initial step 402, the control device 214 keeps the switch 212 in the open state by not supplying it with a control voltage $v_{GS}$ (the voltage $v_GS$ is zero). The discharge current $i_D$ is thus zero. Furthermore, the thermistor 210 is at ambient temperature (for example around 85° C.) and has the resistance RT associated with this temperature. The voltage $v_{Ds}$ is equal to the voltage E of the capacitor C1, which is itself equal to the high voltage HT.

During a step 404, the control device 214 receives the discharge command CMD and, in response, provides the switch 212 with the control signal $v_{GS}$, which in the example described is constant at a predefined value, for example at the value $v_{GS3}$.

During a step 406, in response to the control signal $v_{GS}$, the switch 212 changes to the closed state and drains a discharge current $i_D$, which enters through the first end 206, flows through the thermistor 210 and the switch 212 one after the other, and emerges through the second end 208. Because of the appearance of the discharge current $i_D$, the voltage $v_{RT}$ across the terminals of the thermistor 210 takes the value $RT \times i_D$.

During a step 408, the control device 214 maintains the control signal $v_{GS}$, for example at a constant value (such as the value $v_{GS3}$), or alternatively following predefined variations provided by the control device 214 during a discharge time.

During this discharge time, the thermistor 210 fulfills its first function of power dissipation by dissipating most of the power (at least 10 times more power than the switch 212, as explained above). At the same time, the thermistor fulfills its second function of thermally protecting the discharge by being heated (for example up to 105° C.) because of the flow of the discharge current $i_D$, so that the resistance RT increases. As explained above, this has the effect of decreasing the voltage $V_{DS}$ of the switch 212 and therefore of decreasing the discharge current $i_D$, which reduces the heating of the thermistor 210. The temperature of the thermistor 210 is thus regulated.

In parallel, the discharge current $i_D$ discharges the capacitor C1 and causes the reduction of the voltage E to an acceptable threshold, for example less than 60 V, at the end of the discharge time.

It will be appreciated that during the discharge time, by virtue of the fact that the control device 214 is connected to the switch 212 while avoiding the thermistor 210, the control signal $v_{GS}$ is maintained independently of the variations in the resistance RT of the thermistor 214. In other words, the control signal $v_{GS}$ is not affected by the variations in the resistance RT.

When the control device 214 is designed to keep the control signal $v_{GS}$ constant, the control signal $v_{GS}$ remains constant, independently of the variations in the resistance RT.

When the control device 214 is designed to vary the control signal $v_{GS}$ during the discharge, these variations are carried out as provided by the control device 214, independently of the variations in the resistance RT. At the same time as the active discharge, the thermistor fulfills its third function of verification by allowing the verification module 226 to monitor the current $i_D$ by means of the voltage $v_{RT}$. In case of divergence between the measured voltage and the voltage expected according to the command CMD, the verification module 226 sends an error message to the computer 215.

Referring to FIG. 5, an active discharge device 500 of the automobile 100 according to a second embodiment of the invention will now be described.

The active discharge device 500 is identical to that of FIG. 2, except that the thermistor 210 and the switch 212 are interchanged. Thus, the input terminal D of the switch 212 is connected to the first end 206, whereas the thermistor 210 is connected, on the one hand, to the output terminal S and, on the other hand, to the second end 208.

It will be appreciated that the connection 220 is connected to the point P of the branch 204 which is located between the output terminal S of the switch 212 and the thermistor 210, so that the connection 218 for providing the control signal $v_{GS}$ of the control device to the output terminal S avoids the thermistor 210. Thus, the control signal $v_{GS}$ is always independent of the resistance RT of the thermistor 210.

It will furthermore be appreciated that the connection of the verification module 226 to the terminals of the thermistor 210 is simplified in comparison with the circuit of FIG. 2 by the fact that the thermistor 210 is connected by one of its terminals to the electrical ground 209, so that the voltage $v_{RT}$ is taken with reference to the electrical ground 209.

The operation of the active discharge device 500 is identical to that of the active discharge device 200.

It may be seen clearly that an active discharge device such as those described above makes it possible to limit the power dissipated by the switch.

The present invention is not limited to the embodiments described above, but rather is defined by the following claims. It will indeed be apparent to the person skilled in the art that modifications may be made thereto.

For example, the control signal may constitute an absence of voltage (or a zero voltage) rather than a nonzero voltage.

Furthermore, the terms used in the claims should not be understood as being limited to the elements of the embodiments described above, but rather should be understood as covering all the equivalent elements which the person skilled in the art may infer on the basis of their general knowledge.

The invention claimed is:

1. A device for actively discharging an electrical energy storage device, comprising:
a branch comprising:
first and second ends configured to be connected respectively to positive and negative terminals of the electrical energy storage device, and
between the two ends, a thermistor having a resistance that increases with a temperature of the thermistor and a switch to receive a control signal to change from an open state to a closed state, the thermistor and the switch being connected to one another so that, when the switch is closed, a discharge current enters through the first end, flows through the thermistor and the switch one after the other, and emerges through the second end; and
a device for controlling the switch;
wherein the control device is connected to the switch so as to provide the control signal independently of the resistance of the thermistor, and
wherein the resistance of the thermistor at 25° C. is at least 10 times higher than a resistance of the switch in the closed state.

2. The active discharge device as claimed in claim 1, furthermore comprising at least one connection for providing the control signal, which connects the control device to the switch, and wherein the thermistor is located outside each connection for providing the control signal.

3. The active discharge device as claimed in claim 2, wherein the switch has an input terminal for the discharge current, an output terminal for the discharge current and a control terminal, wherein the control signal is a control voltage between the control terminal and the output terminal, and comprising two connections for providing the control signal, which connect the control device respectively to the control terminal and to the output terminal.

4. The active discharge device as claimed in claim 3, wherein the thermistor is connected between the first end of the branch and the input terminal of the switch.

5. The active discharge device as claimed in claim 3, wherein the thermistor is connected between the output terminal of the switch and the second end of the branch.

6. The active discharge device as claimed in claim 5, wherein the connection for providing the control signal, which connects the control device to the output terminal, comprises a connection between the control device and a point of the branch that is located between the output terminal of the switch and the thermistor.

7. The active discharge device as claimed in claim 1, wherein the thermistor is thermally decoupled from the switch, by means of a thermal insulation barrier interposed between them.

8. The active discharge device as claimed in claim 1, wherein the thermistor is located at a distance of at least 1 cm from the switch.

9. The active discharge device as claimed in claim 1, wherein the thermistor is configured to perform at least one of the following functions:
dissipating more power than the switch;
limiting the discharge current when the temperature of the thermistor rises; and
having a voltage representative of the discharge current, which is measured by a verification module configured to send an error message when the measured voltage is different than a voltage expected according to a command of the switch.

10. A method for actively discharging an electrical energy storage device, comprising:
providing a control signal to a switch to make it change from an open state to a closed state, the switch forming part of a branch which, in addition to the switch, comprises:
first and second ends respectively connected to positive and negative terminals of the electrical energy storage device,
a thermistor having a resistance that increases with a temperature of the thermistor, the thermistor and the switch being connected to one another between the two ends;
changing the switch to the closed state so that a discharge current enters through the first end, flows through the thermistor and the switch one after the other, and emerges through the second end; and
maintaining the control signal independently of variations in the resistance of the thermistor during a discharge time,
wherein the resistance of the thermistor at 25° C. is at least 10 times higher than a resistance of the switch in the closed state.

* * * * *